(12) United States Patent
Rhie (10) Patent No.: US 9,595,534 B2
(45) Date of Patent: Mar. 14, 2017

(54) U-SHAPED COMMON-BODY TYPE CELL STRING

(71) Applicant: Conversant Intellectual Property Management Inc., Ottawa (CA)

(72) Inventor: Hyoung Seub Rhie, Ottawa (CA)

(73) Assignee: CONVERSANT INTELLECTUAL PROPERTY MANAGEMENT INC., Ottawa (CA)

(*) Notice: Subject to any disclaimer, the term of this patent is extended or adjusted under 35 U.S.C. 154(b) by 0 days.

(21) Appl. No.: 14/938,259

(22) Filed: Nov. 11, 2015

(65) Prior Publication Data

US 2016/0064410 A1    Mar. 3, 2016

Related U.S. Application Data

(63) Continuation of application No. 14/046,281, filed on Oct. 4, 2013, now Pat. No. 9,214,235.

(60) Provisional application No. 61/812,363, filed on Apr. 16, 2013.

(51) Int. Cl.
| | |
|---|---|
| G11C 16/10 | (2006.01) |
| H01L 27/115 | (2006.01) |
| G11C 16/04 | (2006.01) |
| G11C 16/14 | (2006.01) |

(52) U.S. Cl.
CPC .... *H01L 27/11582* (2013.01); *G11C 16/0483* (2013.01); *G11C 16/14* (2013.01); *H01L 27/1157* (2013.01); *H01L 27/11524* (2013.01); *H01L 27/11556* (2013.01)

(58) Field of Classification Search
CPC ................................. H01L 27/11582
USPC ..................... 365/185.17; 257/326
See application file for complete search history.

(56) References Cited

U.S. PATENT DOCUMENTS

| | | | | |
|---|---|---|---|---|
| 8,283,228 B2* | 10/2012 | Alsmeier | .......... | H01L 27/11551 438/257 |
| 8,349,681 B2* | 1/2013 | Alsmeier | .......... | H01L 27/11551 257/E21.309 |
| 8,431,961 B2* | 4/2013 | Liu | ...................... | H01L 27/1158 257/192 |
| 8,742,481 B2* | 6/2014 | Tessariol | .......... | H01L 27/11519 257/296 |
| 9,230,983 B1* | 1/2016 | Sharangpani | ..... | H01L 27/11524 |
| 9,236,396 B1* | 1/2016 | Koka | ................ | H01L 27/11582 |
| 9,252,151 B2* | 2/2016 | Chien | ............... | H01L 29/66825 |

* cited by examiner

*Primary Examiner* — Son Mai
(74) *Attorney, Agent, or Firm* — Conversant IP Management Corp.

(57) ABSTRACT

A flash device comprising a well and a U-shaped flash cell string, the U-shaped flash cell string built directly on a substrate adjacent the well. The U-shaped flash cell string comprises one portion parallel to a surface of the substrate, comprising a junctionless bottom pass transistor, and two portions perpendicular to the surface of the substrate that comprise a string select transistor at a first top of the cell string, a ground select transistor at a second top of the cell string, a string select transistor drain, and a ground select transistor source.

9 Claims, 10 Drawing Sheets

U-SHAPED COMMON-BODY TYPE CELL STRING

CROSS-REFERENCE TO RELATED APPLICATIONS

The present application is a continuation of U.S. patent application Ser. No. 14/046,281 filed Oct. 4, 2013 which claims priority to U.S. Provisional Patent Application No. 61/812,363, filed on Apr. 16, 2013 by Hyoung Seub Rhie, entitled "U-Shaped Common-Body Type NAND Cell String," all of which are herein incorporated by reference in their entireties.

BACKGROUND

Semiconductors may be configured as nonvolatile memory, for example a flash memory device. Flash memory may comprise NAND flash memory and/or other types of flash memory. Flash memory is a commonly used type of nonvolatile memory in widespread use as mass storage for consumer electronics, such as digital cameras and portable digital music players. Such flash memories may take the form of memory cards or USB type memory sticks, each may have at least one memory device.

SUMMARY

In an embodiment, a flash device is disclosed. The flash device comprises a well and a U-shaped flash cell string, the U-shaped flash cell string built directly on a substrate adjacent the well. The U-shaped flash cell string comprises one portion parallel to a surface of the substrate, comprising a junctionless bottom pass transistor, and two portions perpendicular to the surface of the substrate that comprise a string select transistor at a first top of the cell string, a ground select transistor at a second top of the cell string, a string select transistor drain, and a ground select transistor source.

In an embodiment, a flash memory device is disclosed. The flash memory device comprises a cell string built directly on a substrate. The cell string comprises a first portion parallel to a surface of the substrate and a second portion perpendicular to the surface of the substrate. The second portion perpendicular to the surface of the substrate comprises a string select transistor at a first top of the cell string, a ground select transistor at a second top of the cell string, a string select transistor drain, and a ground select transistor source.

In an embodiment, a device including flash memory with cell strings is disclosed. The cell string each comprises two portions perpendicular to a surface of a substrate having string select transistors and ground select transistors at tops of the structure, and one portion parallel to the surface of the substrate, wherein the cell string is directly on the substrate.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

A U-shaped common-body NAND flash device may be built to overcome some issues that some existing vertical NAND flash devices may encounter. For example, some existing vertical NAND flash devices may desire a gate-induced drain leakage (GIDL) technique for an erase operation instead of simply biasing the substrate to a positive erase voltage. For example, with a U-shaped floating-body vertical channel NAND schemes, an erase voltage may not be provided to cell bodies via a pocket p-well. For example, in floating-body type schemes, cell bodies may desire to be positively charged by an electron-hole pair creation mechanism at the reverse biased source/body junction using the gate-induced drain leakage technique. The effectiveness of the gate-induced drain leakage technique may desire to be tuned by engineering of the dopant profile at the source/body junction. The gate-induced drain leakage current may also be many orders of magnitudes smaller than direct charging via a common body node and can negatively influence the duration of the erase operation.

As another example, straight-shaped vertical NAND flash schemes may utilize metal lines for the bit lines that may be coupled to a drain while the sources lines may be located at the bottom of the flash structure. The source line may be n-type implanted silicon and thus may have much higher resistance compared to the bit line. The U-shaped common-body NAND flash device may utilize an n-type implanted drain and source and may not have the high resistance issue with the source line. Moreover, the direction of the source lines of the U-shaped common-body NAND flash device may be chosen to either run in the bit line or the word line direction.

The U-shaped common-body NAND flash device may comprise a pocket p-well and U-shaped flash cell strings built directly on a substrate adjacent the pocket p-well. The U-shaped flash cell string may comprise one portion parallel to the device surface and two portions perpendicular to the device surface. The two portions perpendicular to the device surface may comprise a string select transistor at a first top of the string, a ground select transistor at a second top of the string, a junctionless drain, and a junctionless source. The portion parallel to the device surface may be formed by a bottom pass transistor. The body of the bottom pass transistor and the body of the flash cell string may be in direct contact with the substrate. During an erase operation when the substrate is biased with an erase voltage, the cell string body and the substrate may form a single common electrical node.

The U-shaped common-body NAND flash device may have a simple manufacturing process. The horizontal portion of the U-shaped string may not require such complicated steps as the formation of horizontal cavities and subsequent filling, or alignment of vertical and horizontal portions of the strings, but may be manufactured using well established semiconductor manufacturing processes. The two vertical portions of a U-shaped string may be perpendicular to the chip surface, and the horizontal portion of the U-shaped string may be parallel to the chip surface. The bottom pass transistor may be manufactured at the same time and with the same process as the conventional NAND cell transistors in the core/periphery of the chip outside the cell region.

Figure 1A:
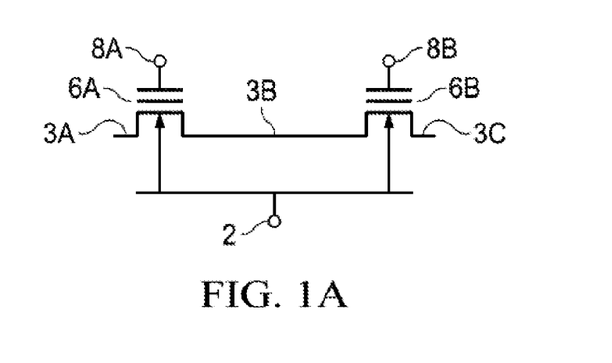
FIGS. 1A and 1B are illustrations of NAND flash cell transistors.
Figure 1B:
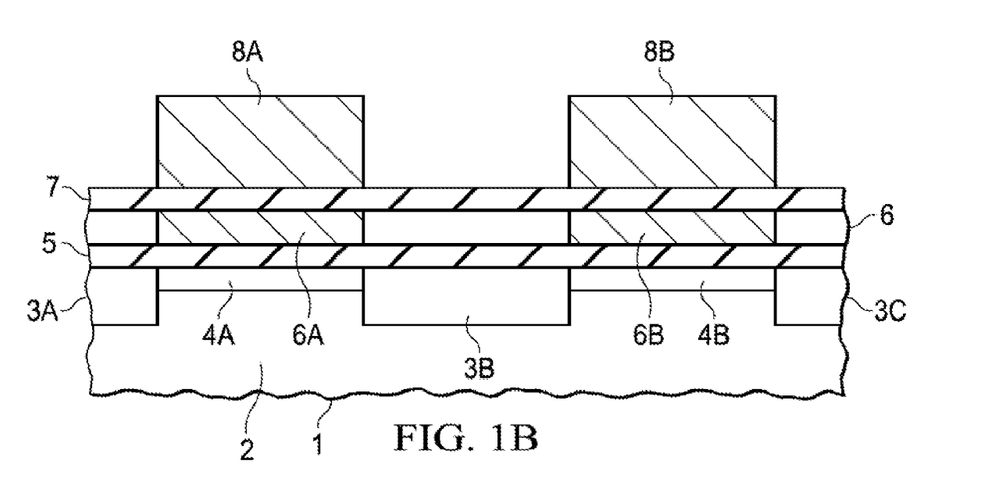

FIG. 1A illustrates the scheme of two NAND flash cell transistors serially connected to each other. In an embodiment, the two transistors comprise two control gates 8A/8B, two floating nodes (or storage nodes) 6A/6B, three source/drain nodes 3A-3C, and a cell body node 2. An example vertical structure of the two NAND flash cell transistors is shown in FIG. 1B. A typical NAND flash cell may be manufactured on a semiconductor substrate 1, for example monocrystalline or polycrystalline silicon. The semiconductor substrate 1 may form the body node 2 of the cells which is a p-well in most known NAND flash cells. It is understood that although not shown in FIG. 1, the semiconductor substrate 1 may be manufactured on a dielectric material to form a silicon on insulator (SOI) structure. It should be noted that FIG. 1 and the related description are not to limit the embodiments of the present disclosure to any specific technology or device structure, but serve as an illustration to define terms for later use herein.

The silicon substrate 1 may comprise the source/drain regions 3A-3C. In some older schemes the source/drain regions 3A-3C may comprise diffused regions with n-type doping, for example n+ source/drain 3A-3C. In some more recent schemes the source/drain regions 3A-3C may not be formed through heavy ion implantation as permanently conducting regions, but the conductivity may be controlled by electric fringe-fields from the control gates 8A/8B, whereby a high enough bias at the control gates 8A/8B may induce conductive inversion layers in the source/drain regions 3A-3C in the same manner as a channel inversion layer forms when a transistor is turned on. These types of cells are called "junctionless" cells.

It is understood that the channel regions 4A/4B are only in a conductive state if the electric field between the charge storage node 6A/6B and the substrate 1 is high enough to induce an inversion layer. This electric field is caused by a combination of the charge stored in the charge storage layer 6 and the external bias that is applied to the control gate 8A/8B.

A tunnel dielectric layer 5 may be formed on the semiconductor substrate 1. A charge storage layer 6 may be formed on the tunnel dielectric layer 5. The charge storage layer 6 may be a charge trap layer which comprises the locations where electrons are trapped, for example the floating nodes 6A/6B. For example, as shown in FIG. 1B, it may not be necessary to isolate charge storage nodes 6A/6B by way of manufacturing, as charge flow between adjacent charge storage nodes 6A/6B may not occur due to the insulating nature of the charge trap layer. The charge trap layer may thus be manufactured as a continuous thin film without patterning it into multiple isolated pieces. The charge trap technology may be as so-called S(silicon)-O (silicon oxide)-N(silicon nitride)-O(silicon oxide)-silicon technology. Alternatively, the charge storage layer 6 may be implemented with floating gate technology (not shown in FIG. 1), and the charge storage layer 6 does not form a continuous film but is patterned into separate floating gates where the floating gate of each cell is isolated from the floating gate of adjacent cells. A coupling dielectric 7 may be manufactured on the charge storage layer 6. The control gates 8A/8B may be manufactured on the coupling dielectric 7.

Organization of a NAND Flash Memory Cell Array

Figure 2A:
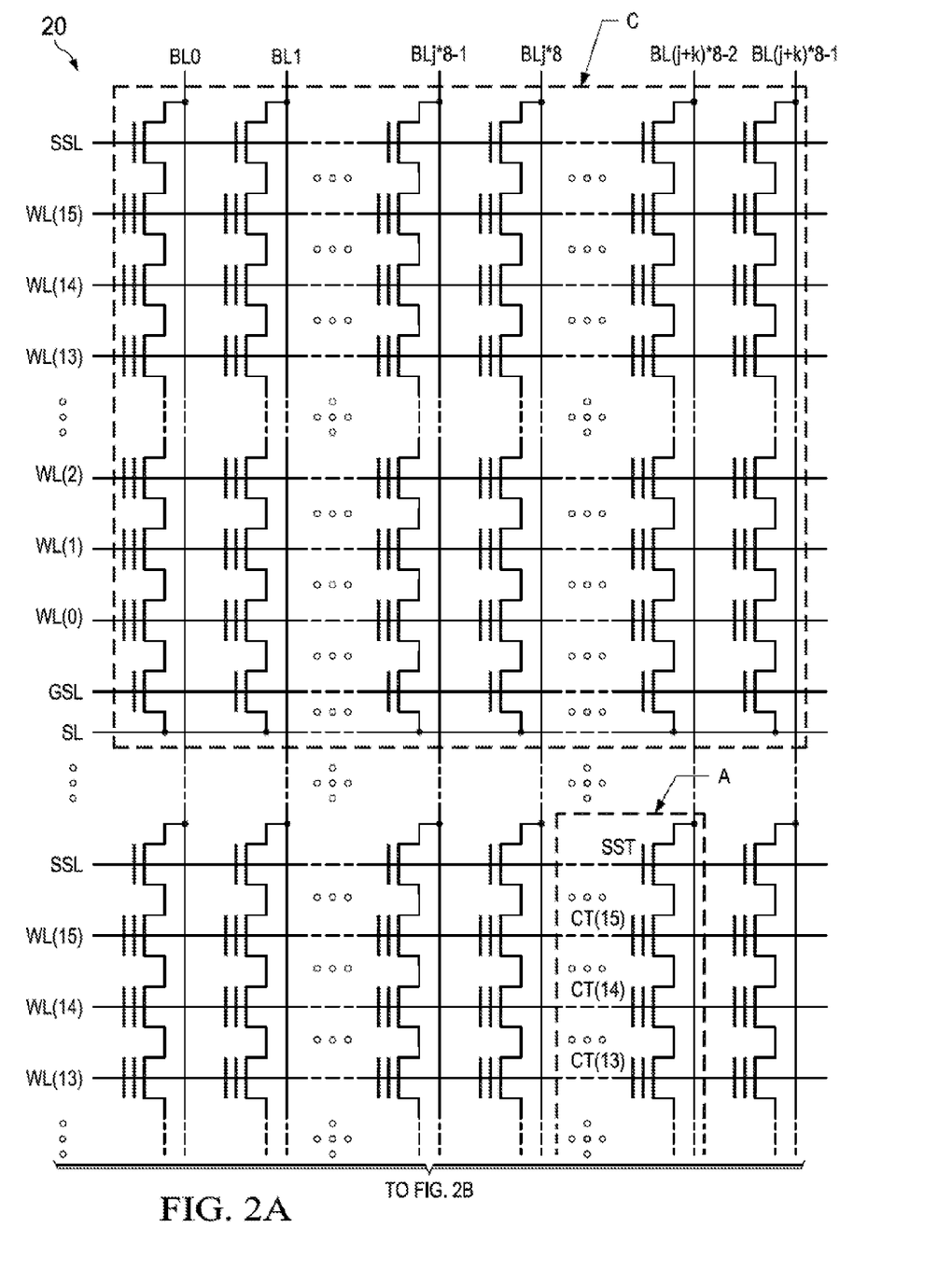
FIGS. 2A and 2B are diagrams of a NAND flash cell.
Figure 2B:
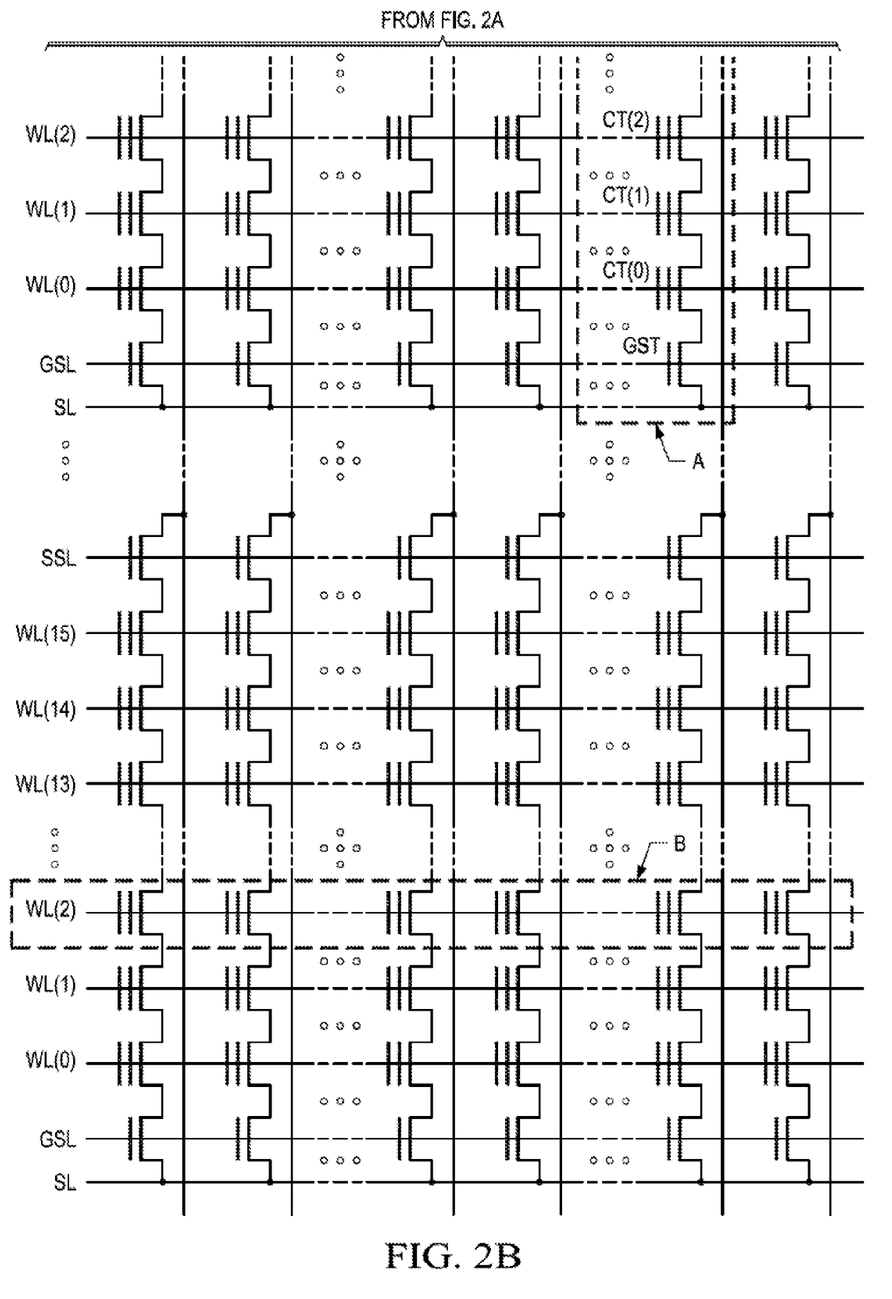

FIGS. 2A and 2B illustrate elements of a NAND flash memory device 20. As indicated, FIG. 2B is a continuation of FIG. 2A. The NAND flash memory device 20 may comprise a string (A), a page (B), and a block (C) in a NAND Flash cell array thereof. In other embodiments, the NAND flash memory device 20 may comprise fewer or greater NAND cell strings, pages, and/or cell blocks.

An example of a NAND cell string will first be described with respect to the portion indicated by box "A" in FIGS. 2A and 2B. At the outset, it is to be understood that although the NAND cell string may be shown as comprising a certain number of memory cells (e.g., 16 cells in this example), the number of memory cells may vary in other implementations. For example, the number of cells per string may vary, with 4 cells per string, 8 cells per string, 32 cells per string, 64 cells per string, 128 cells per string, or any other number greater than 1 also being possible embodiments.

A NAND cell string as illustrated in box "A" of FIGS. 2A and 2B may comprise at least one string select transistor (SST), at least one memory cell transistors (CT), and at least one ground select transistor (GST). The string select transistor may be placed in series between the cell transistors CT(0), CT(1), . . . , CT(14), CT(15) and one terminal, the drain. The drain may be coupled to a bit line. For example, a drain of the string select transistor may be coupled to the bit line denoted as BL(j+k)*8−2 in FIG. 2A. And a source of the string select transistor may be coupled to the drain of the adjacent memory cell transistor. For example, the source of the string select transistor in FIG. 2A is coupled to the uppermost memory cell CT(15). The memory cell transistors may be coupled between the string select transistor and the ground select transistor. The ground select transistor may be serially coupled between the cell transistors and a source line (SL) or common source line (CSL). A drain of the ground select transistor may be coupled to the source of the adjacent memory cell transistor. For example, the ground select transistor in FIG. 2B is coupled to the bottommost memory cell CT(0). And a source of the ground select transistor may be coupled to the source line or common source line.

The memory cell gates in FIGS. 2A and 2B may be coupled to word lines (WL) 0 to 15. The gate of the string select transistor (SST) may be coupled to a string select line (SSL) while the drain of the string select transistor (SST) may be coupled to a bit line (BL). The gate of the ground select transistor (GST) may be coupled to a ground select line (GSL) while the source of the ground select transistor (GST) may be coupled to the source line or common source line (SL or CSL).

To specify a direction within a string "A", the direction towards the string select line of a string will hereinafter be referred to as "drain direction" or "drain side", and the direction towards the ground select line of a string will be referred to as "source direction" or "source side".

The portion indicated by box "B" in FIG. 2B illustrates a page in a NAND flash device. A page may be the smallest unit addressed by a row address. Also, one page may be the smallest unit for which a read or program operation can be performed. One page may be identical to all cells coupled to one word line. Alternatively, cells coupled to a certain word line may be subdivided into multiple subgroups. Thus, a word line may comprise multiple pages, where each page in one word line has a different row address. In the case of multiple bit storage in one physical cell, different bits may belong to different pages although they may be physically located in the same cell transistor and thus coupled to the same word line. Although certain aspects and techniques proposed herein may be described with respect to embodiments such as in FIGS. 2A and 2B where each word line corresponds to one page, it is to be understood that the present disclosure is not so limited, as such aspects and techniques may be employed for any applicable embodiment.

Turning now to the portion indicated by box "C" in FIG. 2A, an example of a cell block is described. The cell block "C" may comprise strings which share the same word lines, the corresponding string select lines, and the corresponding ground select lines. In a NAND flash memory device 20 according to the present disclosure, the smallest unit for which an erase operation is performed may be one cell block. Therefore, a cell block may also be referred to as an "erase block".

Figure 3:
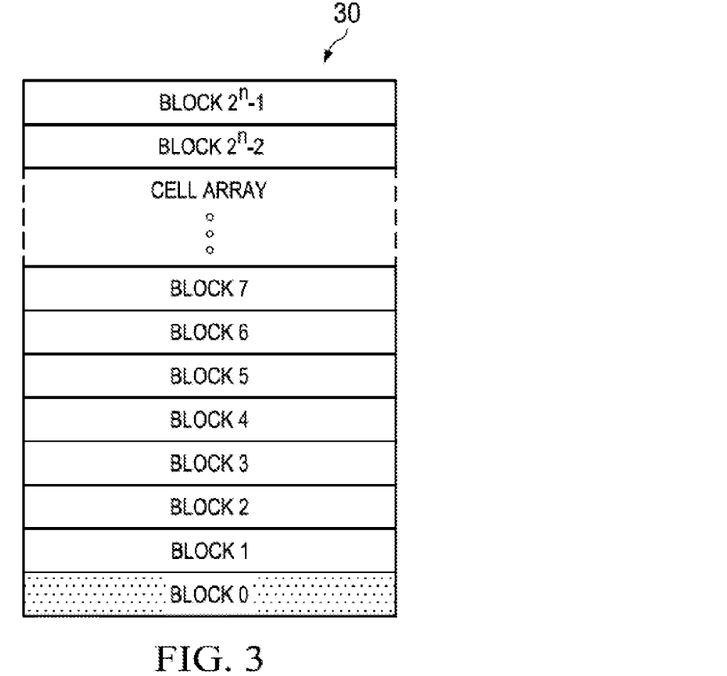
FIG. 3 is a simplified view of a structure of a NAND flash cell array.
Figure 4:
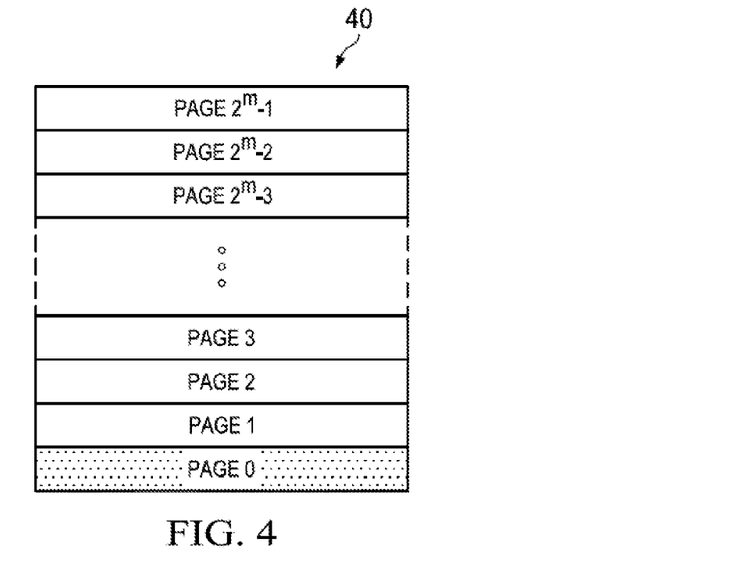
FIG. 4 is a simplified view of a structure of a NAND flash block.
Figure 5:
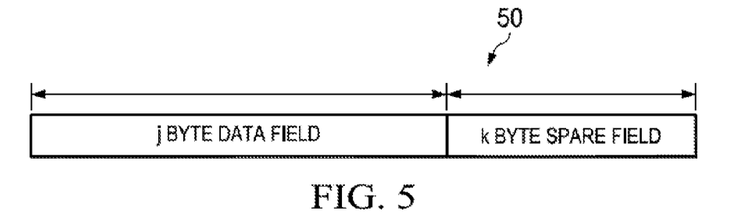
FIG. 5 is a simplified view of a structure of a NAND flash page.

FIGS. 3, 4, and 5 illustrate examples of a cell array structure 30 of NAND flash memory, a NAND flash bock structure 40, and a NAND flash page structure 50 respectively. In these examples, it may be assumed that a row address is made up of n bits for a block address, and m bits for a page address. As shown in FIGS. 3 and 4, a cell array structure 30 may comprise $2^n$ erase blocks, with each block 40 subdivided into $2^m$ programmable pages. Moreover, each page 50 may be divided into a data field and a spare field, as shown in FIG. 5.

The data field defines a j-byte storage region while the spare field defines a k-byte area. The spare field may be used for error management functions. Assuming these two fields make up a page 50, the number of bytes per page 50 may be expressed as follows: 1 page=(j+k) bytes. Assuming a block 40 comprises $2^m$ pages, the number of bytes per block 40 may be expressed as follows: 1 block=$2^m$ pages=(j+k) bytes*$2^m$. Thus, assuming a cell array 30 comprises $2^n$ blocks, the number of bytes in the cell array 30 may be expressed as follows: Total Memory Array Size=$2^n$ blocks= (j+k) bytes*$2^{m+n}$.

Basic Cell Operation of Erase, Program and Read

Electrons trapped in the floating node 6A/6B of a cell transistor may modify the threshold voltage of this cell transistor to different levels depending on the data (0 or 1) stored in the cell. The threshold voltage of the cell transistor may influence the resistance of the channel 4A/4B. In some NAND flash devices, memory cells may store two logic states, data '1' and data '0', and each memory cell corresponds to one bit. In this case the flash memory cell may have one of two threshold voltages corresponding to data '1' and data '0'. These types of memory cells may be referred to as single-level cells (SLCs). In some other NAND flash devices, cells may also be programmed to more than two threshold levels, and thus multiple bits can be stored in one physical cell. These types of NAND memory cells may be referred to as multi-level cells (MLCs). Embodiments of the present disclosure may apply equally to NAND memory devices with single- and/or multi-level cells.

Typically a NAND flash memory cell is erased and programmed by Fowler-Nordheim (F-N) tunneling. Fowler-Nordheim (F-N) tunneling may be the process whereby electrons tunnel through a barrier in the presence of a high electric field. In some program operation schemes, a memory cell may be programmed by applying a highly positive program voltage Vpgm to the control gate 8A of the memory cell, for example 20 Volts (V), while the substrate 2 and source and drain 3A/3B of the cell may be biased to Vss (ground). The high program voltage Vpgm may induce a channel 4A under the tunnel dielectric 5. Since this channel 4A is electrically connected to the source and drain 3A/3B which are tied to Vss=0V, the channel voltage Vch is also tied to ground. Due to the difference between the program and channel voltages, Vpgm−Vch, electrons from the channel 4A may be uniformly injected to the floating node 6A through the tunnel dielectric 5. The cell threshold voltage Vth of the programmed cell may be shifted in the positive direction. In other words, the programmed cell may be turned off with a gate bias of 0V.

In order to read cell data, the control gate 8A may be biased to 0V, and the drain 3B may be biased to a read voltage Vrd, for example 5V while the source of the cell may be set to 0V. If the cell is in an erased state, the erased cell has a negative threshold voltage, and the erased cell will turn on. Thus, a cell current (Icell) from the drain 3B to the source 3A may flow under the given read bias condition. Alternatively, if the cell is in a programmed state, the programmed cell has a positive threshold voltage, and the cell will not turn on. Thus, no cell current may flow from the drain 3B to the source 3A under the given read bias condition. An erased cell (on-cell) may be sensed as data '1' and a programmed cell (off-cell) may be sensed as data '0'.

During an erase operation, the control gate 8A of a cell may be biased to Vss while the cell body 2 may be biased to an erase voltage V_erase (e.g. 18 V), and the source and drain 3A/3B of the cell may be floated. No conductive inversion layer channel 4A may exist in erase bias conditions because the cell transistors are turned off. With this erase bias condition, trapped electrons in the floating node 6A may be emitted uniformly to the substrate 2 through the tunnel dielectric 5. The cell threshold voltage Vth of the erased cell may become negative. In other words, the erased cell transistor may be set to an on-state with a gate bias voltage of 0V. An erase operation is not applied to single cells in NAND flash memory but to entire erase blocks.

Well Structure and Erase Biasing

In an embodiment, an erase operation may be performed on entire blocks, not individual cells. The erase operation is performed by biasing the cell body node with a positive erase voltage V_erase while tying the control gates of cells belonging to the same block via the corresponding word lines to 0V. In most known schemes, the cell body node is identical to the substrate on which the cell transistors are manufactured, therefore biasing of the cell body node is achieved by biasing the substrate. In the present disclosure the term "substrate" or "silicon substrate" may refer to the semiconductor wafer substrate that forms the body of transistors in a flash device chip for peripheral circuits, for example monocrystalline or polycrystalline silicon. The term "substrate" is used in distinction to deposited layers like interlayer dielectrics or deposited silicon layers in some vertically stacked NAND cell technologies.

Figure 6:
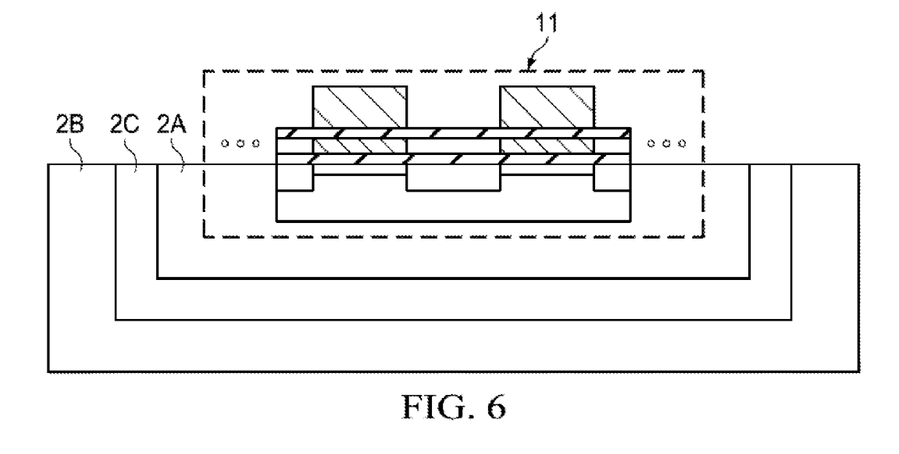
FIG. 6 is a simplified view of a pocket p-well structure of a NAND flash device.

FIG. 6 illustrates how the substrate is divided into a well structure in some NAND flash devices, and how the cell body node is electrically connected to the overall well structure of the substrate. FIG. 6 is not drawn to scale and is not to be used to specify any specific cell structure for the present disclosure. NAND flash cells 11 may be manufactured in a pocket p-well structure where a pocket p-well 2A of the cell region is isolated from the p-well 2B of the rest of the chip via an isolating tub n-well 2C. In a pocket p-well structure as shown in the figure, the term cell substrate or p-well of the cell region will be used synonymously to the pocket p-well 2A. The cell body node of each cell transistor is identical to the pocket p-well node 2A. Therefore, the cell bodies may form one common node with the cell substrate (pocket p-well) 2A.

An erase operation may be performed by simply biasing the entire cell substrate (pocket p-well) 2A with an erase voltage V_erase. In some vertical NAND flash devices, the cell bodies of each cell transistor may not form one common node with a cell substrate, and an erase operation may not be performed by simply biasing a cell substrate with an erase voltage.

Vertical Cell Transistors

Figure 7:
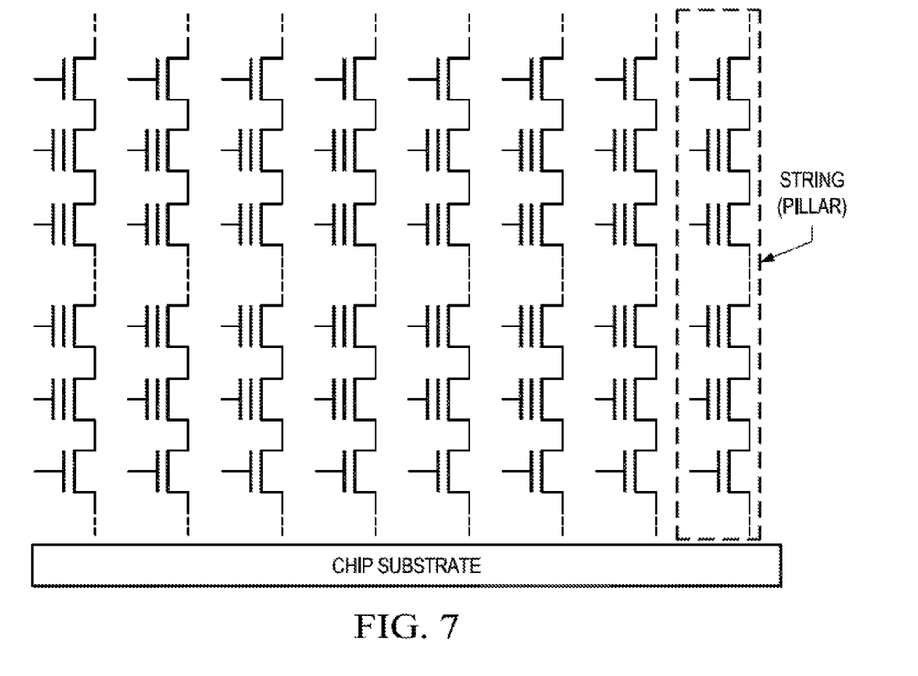
FIG. 7 is diagram of vertical NAND cells with strings running in a direction perpendicular to a chip substrate.

The desire to reduce manufacturing costs per data bit may lead the NAND flash industry to reduce the size of the cell transistors. Due to the limitations imposed by photolithography tools and the limits of shrinking the physical transistor size, NAND cells may be stacked in a direction perpendicular to the chip surface. Thereby the effective chip area per data bit may be reduced without relying on the shrinkage of the physical cell transistor size. Some of the embodiments disclosed herein may apply specifically to vertically stacked NAND flash transistor cells. From a geometrical point of view two different types of vertical NAND Flash memory may be used: 1) cell strings run in a direction perpendicular to the chip substrate, as shown in FIG. 7, whereby cells which belong to the same string may be stacked vertically on top of each other; and 2) cell strings run in a direction parallel to the chip substrate, whereby cells which belong to the same string may be aligned in a direction parallel to the chip surface as in conventional NAND cells, but different strings may be stacked vertically on top of each other. Flash devices configured according to case 1 above will be referred to herein as Vertical Channel NAND or VC NAND. Flash devices configured according to case 2 will be referred to herein as Vertical Gate NAND or VG NAND. The claimed embodiments relate to case 1, Vertical Channel (VC) NAND structures.

Some embodiments described herein may comprise NAND cell transistors comprising n-channel transistors on p-type (or undoped) substrate. However, this is not a necessary requirement of all embodiments. For example, in some embodiments, n and p-type impurities for the transistors and substrate may be replaced by other types of impurities, or the substrate may consist of undoped silicon.

U-Shaped Common-Body VC NAND

Figure 8A:
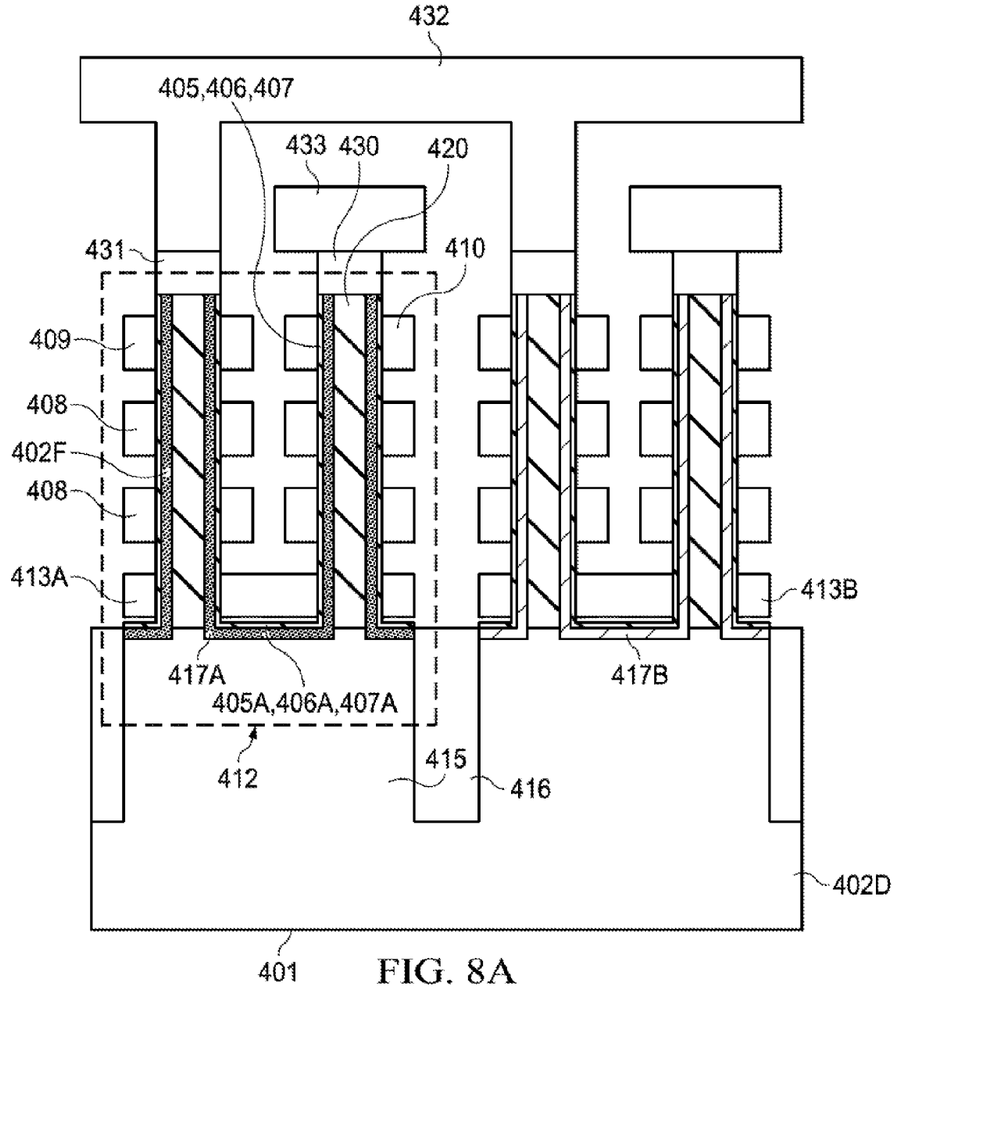
FIG. 8a is an illustration of a U-shaped common-body NAND flash device according to an embodiment of the disclosure.
Figure 8B:
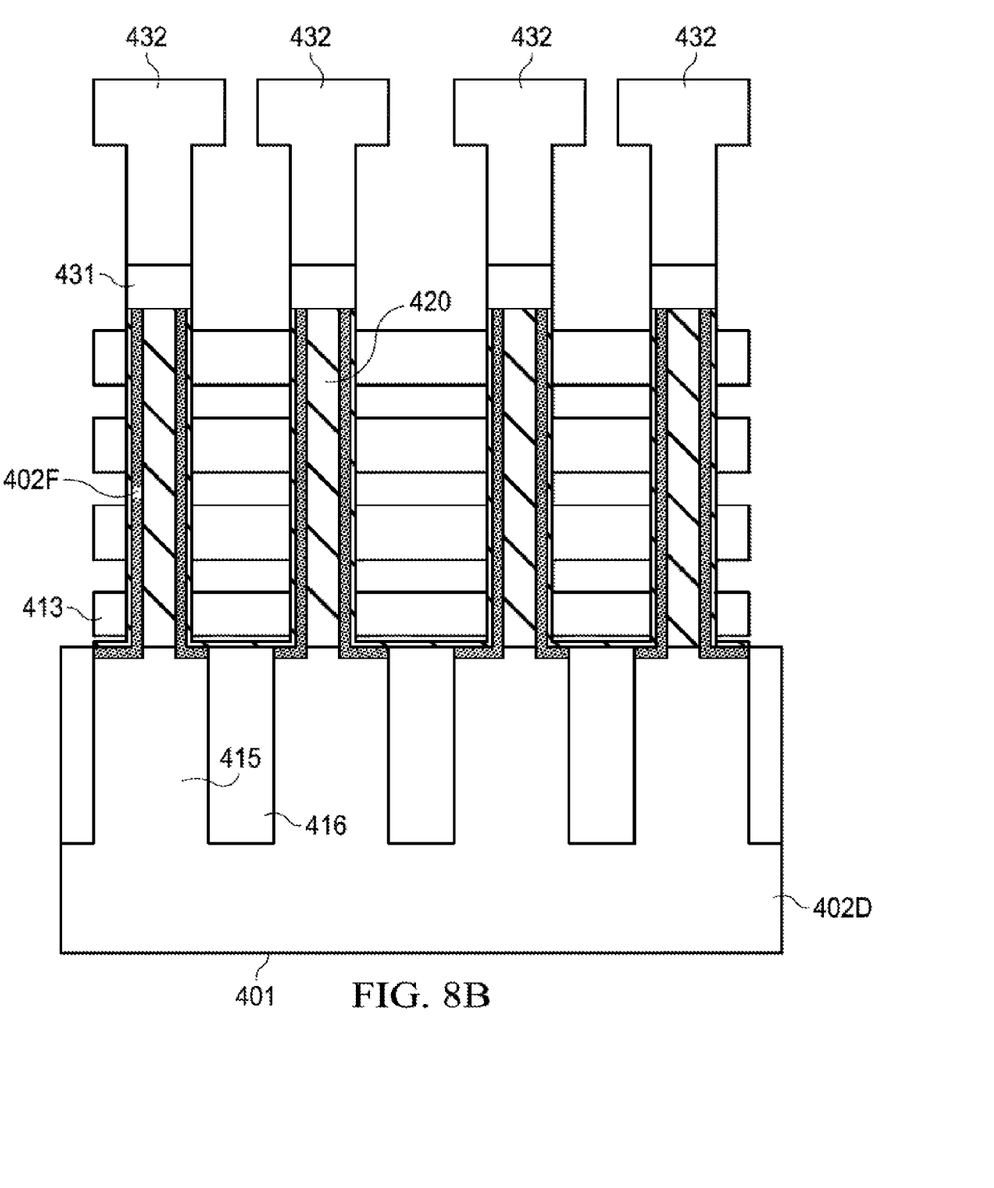
FIG. 8b is an illustration of a different view of a U-shaped common-body NAND flash device according to an embodiment of the disclosure
Figure 9:
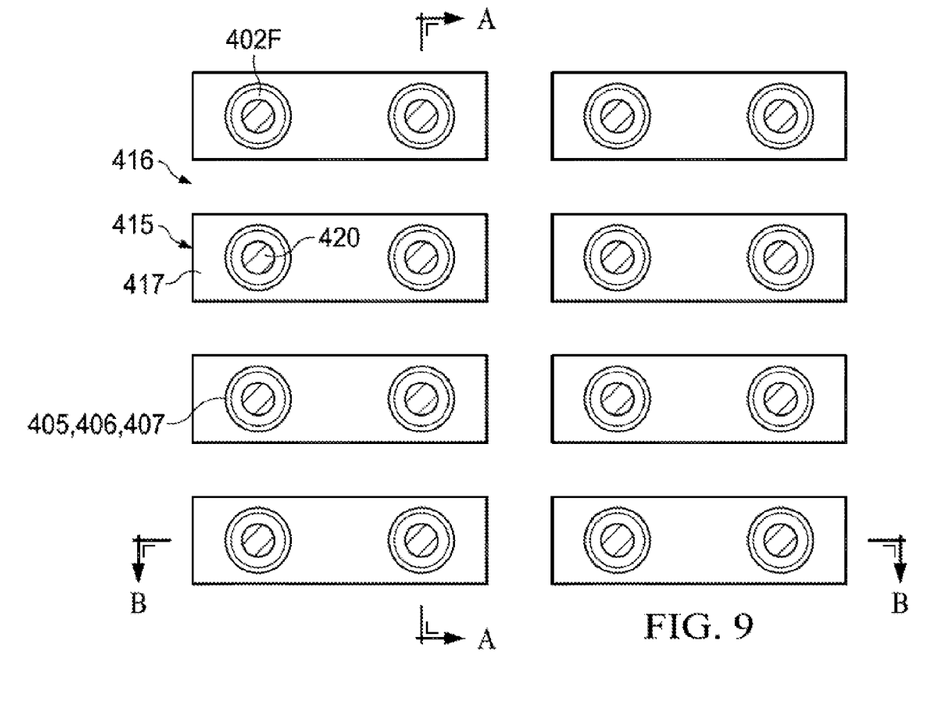
FIG. 9 is an illustration of a top view of a U-shaped common-body NAND flash device according to an embodiment of the disclosure.

FIGS. 8a and 8b show vertical cross sections, wherein FIG. 8a shows a cut in the bit line direction and FIG. 8b shows a cut in the word line direction. The horizontal cut in FIG. 9 shows the substrate pattern structure viewed from above. In an embodiment, the cell transistors comprise control gates 408, gate dielectrics 405-407, and the cell body 402F. The control gates 408 are also the word lines of the array. The cell body 402F may comprise a deposited layer of silicon. Interlayer dielectric material, for example undoped silicon oxide may fill all regions in FIG. 8a which are not specified otherwise, but are not drawn for simplicity.

Strings 412 are bent in a U-shape. A string 412 comprises two vertical pillar-shaped portions and a horizontal portion. The horizontal portion may connect the two vertical portions electrically. The two vertical portions may be perpendicular to the chip surface, and the horizontal portion may be parallel to the chip surface. The portion parallel to the chip surface will hereinafter be referred to as "vertical portion", and the portions perpendicular to the chip surface will be referred to as "horizontal portion". The horizontal portion of the string 412 may comprise a bottom pass transistor 413A.

For simplicity, the tunnel dielectric 407, the charge trap layer 406, and the coupling dielectric 405 are not drawn separately in FIG. 8a/b. The cell body 402F may surround a non-conductive dielectric core 420 and thus form a silicon on insulator (SOI) structure. On the other hand, the cell body 402F may fill the string hole up to the innermost region without any non-conductive dielectric core 420 inside the cell body 402 F. In this case, the non-conductive dielectric core 420 in FIG. 10 may be replaced by the cell body 402F. In other words, both the regions of 420 and 402F in FIG. 10 may be marked as 402F.

Figure 10:
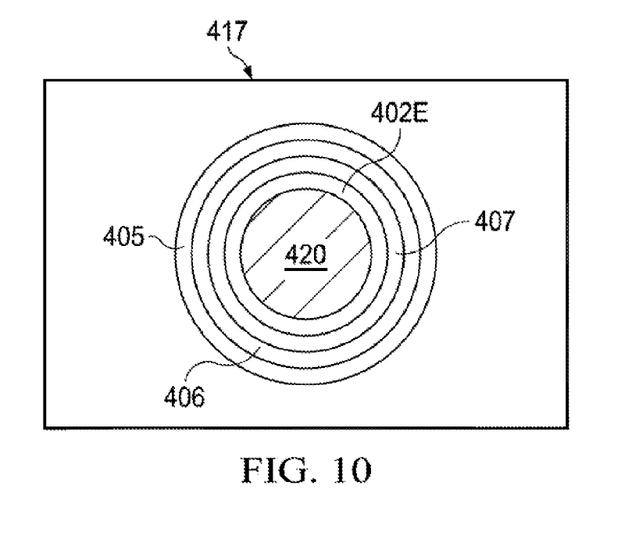
FIG. 10 is an illustration of a layer structure of a single string hole of a U-shaped common-body NAND flash device according to an embodiment of the disclosure.

FIG. 9 shows the vertical portions of the strings comprising contact holes which are subsequently filled from the outside to the inside by the coupling dielectric 405, the charge storage layer 406, and the tunnel dielectric 407. The cutting line "A" corresponds to the vertical cross section of FIG. 8b, and the cutting line "B" corresponds to the vertical cross section of FIG. 8a. FIG. 10 illustrates a single string hole in detail to show the multi-layer structure of layers 405-407.

The string select transistor (SST) 409 and a ground select transistor (GST) 410 of each string are located at a first top and a second top of the stacked cells. The SST 409 and the GST 410 may each have an n-type implanted drain 431 and an n-type implanted source 430 respectively at the top side. The drain 431 and source 430 may connect to the bit line 432 and the source line 433 respectively. The manufacturing process of the NAND structure may start from the bottom, continue in the direction from the bottom to the top, and finish at the top, for example layer by layer from the bottom to the top.

Dopant diffusion may be a byproduct of a thermal process, which is unintentional and may be undesirable. When both the SST 409 and GST 410 are at tops of the stacked cells, the scheme is more robust to dopant diffusion since the impurity implant process for the SST 409 and GST 410 may be conducted after the cell stacking process. The source/drain 430 and 431 dopant diffusion may not be affected by high temperature processes that may be introduced during the manufacturing of the underneath cells. In other words, even if the cell stacking process before the implant process for the SST 409 and GST 410 is conducted in high temperature, since the SST 409, GST 410, and source/drain 430 and 431 may be manufactured after the stacking cells, the SST 409, GST 410, or source/drain 430 and 431 may not be affected by the previous high temperature processes.

Except for the mentioned n-type regions 431 and 430, source/drain regions within the cell string may not be formed by an implant process, but instead may be so called "junctionless" or "virtual" sources/drains. This means that the source/drain regions of the cell transistors, except the n-type source and drain regions 430 and 431, may comprise electric-field-induced conductive inversion layers like the transistor channels when transistors are turned on. In other words, when the control gates 408 are biased with high enough voltage, a conductive inversion layer may be induced in the source/drain regions. This does not mean that no dopant implant process may be utilized during manufacturing at all. Rather it means that the formation of conductive source/drain regions is not achieved and does not rely on permanent heavy n+ implantation/ion implantation.

The vertical portions of the strings may be manufactured in direct contact with the substrate silicon 401. There may be no n-type diffused region at the bottom end of the vertical portions which may serve as n+ sources/drains in other NAND schemes. For example in an embodiment, the bottom pass transistor 413A/B may not comprise heavily n-type (or p-type) implanted source/drains, but may be a junctionless transistor like the cell transistors of the vertical portions of the structure. Source/drain regions and channel regions of those junctionless transisitors may be in a conductive state if inversion layers are induced by turning on the junctionless transistors. Thus, horizontal conductive regions at the bottom part of the strings in the substrate 401 may exist only when inversion layers are induced by turning on the bottom pass transistors 413A/B when it is needed. In other words, the horizontal electrical connection through the body of the bottom pass transistor 413A/B may not rely on the existence of a permanent heavily doped n-type region. In other words, the bottom pass transistor 413A/B may not include any n+ implemented source or drain and instead the conductivity of the bottom pass transistor 413A/B may be entirely based on a conductive channel 417A/B that is formed when the bottom pass transistor is in a turned on state. However, it should be understood that this does not imply that no dopant implantation may be involved at all. For example, other types of doping may still be conducted. For example, p-type well doping throughout the body of the entire string, doping to adjust some threshold level, or another type of doping.

The gate dielectric layers 405A-407A at the location between the gate of the bottom pass transistor 413A and the transistor body may or may not be a multi-layered structure like those for the cell transistors. For simplicity of manufacturing, the gate dielectric 405A-407A of the bottom pass transistor 413A may be a multi-layered structure like in FIG. 10 when it is inside the vertical pillar-shaped portion of the string. On the other hand, the gate dielectric 405A-407A of the bottom pass transistor 413A may be a single-material gate oxide as may be used elsewhere in the chip (e.g. core, periphery) when the gate dielectric 405A-407A is facing the substrate 401. Or the gate dielectric 405A-407A of the bottom pass transistor may be chosen to be a single-material layer regardless of whether it is facing the vertical or horizontal portion.

The substrate 401 underneath the strings may be patterned into island active patterns 415 which are separated from each other by trenches ("field") 416. The trenches 416 may be filled with a non-conductive material, for example silicon oxide. For example, a conductive channel 417A of the bottom pass transistor 413A may extend as far as a few nanometers in depth beneath the gate dielectric 405A-407A while the trench 416 may have a depth of a few hundred nanometers. The trenches 416 may serve as electrical isolations between conductive channels 417A and 417B of adjacent bottom pass transistors 413A and 413B. For example, the trench 416 may ensure that the conductive channels 417A/B of turned-on strings are electrically isolated from each other.

Figure 12:
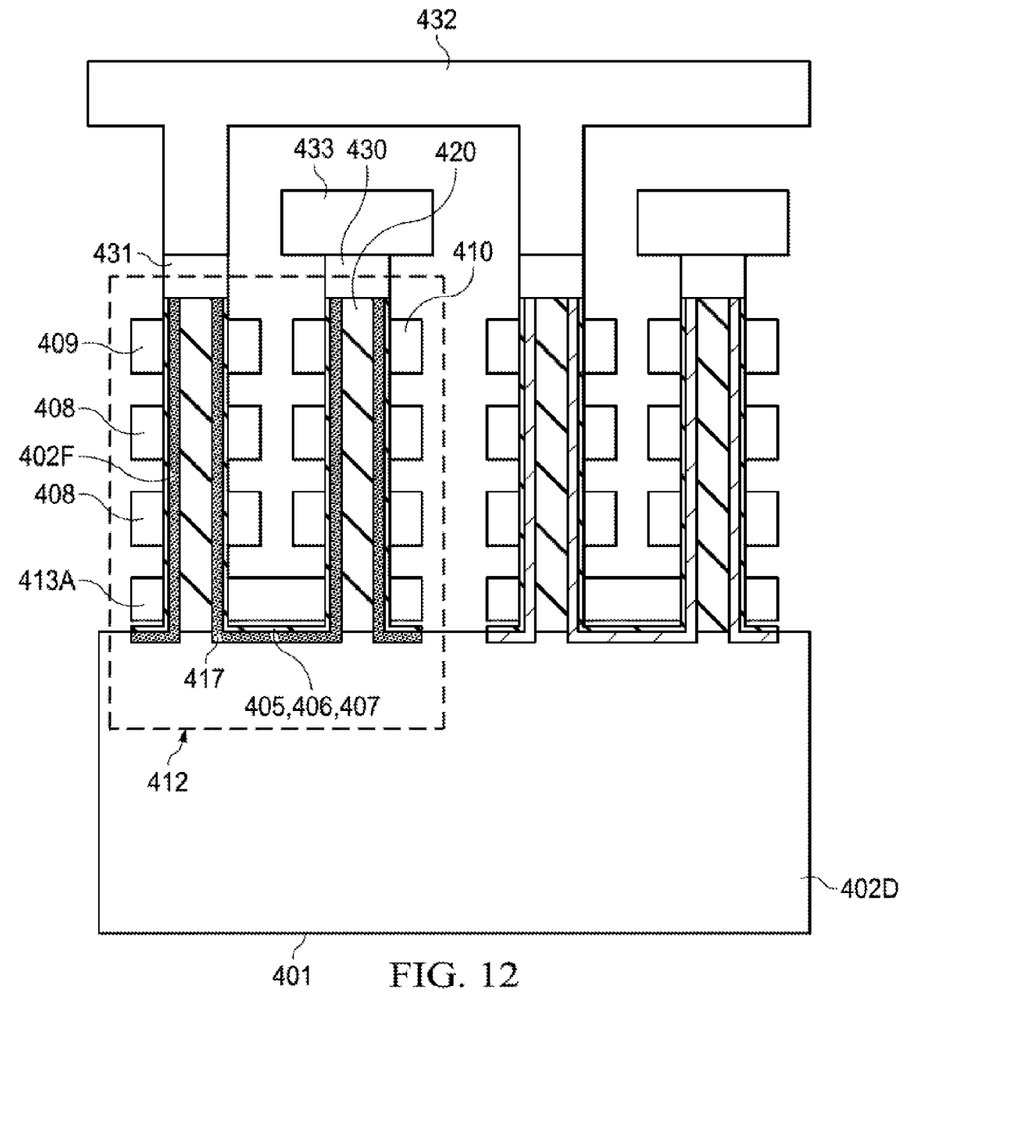
FIG. 12 is a simplified view of a structure of a U-shaped common-body NAND flash device according to an embodiment of the disclosure.

Alternatively, the isolation between channels of adjacent strings is not achieved by isolating patterns but by placing a sufficiently large distance between adjacent strings. This is illustrated in FIG. 12 which shares all elements with the embodiment in FIG. 8a/b except for the active/field pattern in the substrate. Isolation between adjacent strings may be ensured by restricting the horizontal conductive channel to a region close (few nanometers) to the bottom pass transistor. The distance between adjacent strings may be chosen to be large enough (for example 50 nanometers or more) so that the conductive channels of the adjacent bottom pass transistors do not overlap. Additionally, the isolation between channels of adjacent strings may be achieved by another method.

The bottom pass transistor 413A/B is directly manufactured on substrate 401. And the gate of the bottom pass transistor 413A may be facing two different types of semiconductor bodies: the bottom-most portion of the bodies 402F of the vertical portions of the strings and the substrate 401. Since the body inside the vertical portion of the string is in direct contact with the substrate 401 without any electrical barrier between the body inside the vertical portion and the substrate 401, the overall body node of the bottom pass transistor 413A may be one common node with the underlying p-well of the substrate 401 on which the transistor is manufactured. Additionally, the body of the entire string may be the same node as the underlying substrate 401 on which the string is built.

Assuming that all word lines, string select lines, and ground select lines of the left-most string 412 of FIG. 8a are selected and thus all the cell transistors, the SST 409, the GST 410, and the bottom pass transistor 413A are in a turned-on state for the left-most string 412. A conductive string channel may form from the bit line 432 to the source line 433. And a current may flow in the direction from the drain 431 to the source 430. The conductive channel is indicated in FIG. 8a by the dark-grey shaded cell string body 402F whereas no such conductive channel is drawn in the turned-off right string. FIG. 8b shows strings all belonging to the same block and being in a turned-on state with conductive channels. All strings on the left side of FIG. 9 are in a turned-on state as shown by the dark shade which indicates conductive channels. The strings on the right side of FIG. 9 are all in a turned-off state, and are not shown in any dark shade. Regions covered by a turned-on bottom pass transistor 413A built directly on the substrate 401 may bear a conductive channel 417A. The conductive channel 417A may run in a horizontal direction like the gates of bottom pass transistors 413A.

Although all strings are manufactured on the same substrate 401, the island-shaped active/field patterns 415 may ensure that no conductive leakage path exists between the channels of two adjacent strings when they are in a turned on state. For example, a string channel during read or program operation may be isolated from any adjacent string channel. In particular, no conductive path may exist between two adjacent bottom pass transistor channels 417A and 417B when the two bottom pass transistors 413A and 413B are in a turned on state as conductive channels in general may be confined to a vertical depth which is in close vicinity to the gate dielectric 405-407 of the corresponding transistors. For example, the conductive channels of the bottom pass transistors 417A and 417B may extend as far as a few nanometers in depth beneath the gate dielectric 40A5-407A whereas the field isolation between two adjacent strings may be around a few hundred nanometers.

In an embodiment, the erase bias conditions may be achieved by biasing the substrate 401 on which the cell strings are manufactured with a high positive erase voltage, for example 18V while tying the control gates of the cells belonging to the same block via the corresponding word lines to 0V. The cell bodies which are located within the vertical portions of the strings are of the same conductivity type as the p-well of the substrate 401. For example, the cell bodies located within the vertical portions of the strings may be doped with p-type impurity so that the cell bodies and the p-well are of the same type of conductivity. Thus, both the substrate 401 and the cell bodies may form a common electrical node during erase operation. When the substrate 401 is charged with the erase voltage, the cell bodies may also be charged with the same erase voltage. It should be noted that the impurity type of the cell bodies within the vertical portions of the strings may not be p-type, or the cell bodies may not be conductive at all outside of the erase operation. However, the conductivity type of the cell bodies within the vertical portions and the substrate 401 are of the same type.

In particular, the bottom of the strings may not comprise heavily implanted n+ regions like diffused source lines which may be of an opposite conductivity type from the p-type cell bodies or the substrate as in some existing NAND schemes, for example in straight-shaped floating-body NAND schemes. Additionally, the bodies of the cell strings may not be completely detached from the substrate 401 as in the U-shaped floating-body NAND scheme. Thus, no electrical barrier may exist between the substrate 401 and the cell bodies. In particular, the cell bodies within the vertical portions of the strings may not be floating nodes isolated from the substrate 401 as in the case of floating-body VC NAND schemes.

Figure 11:
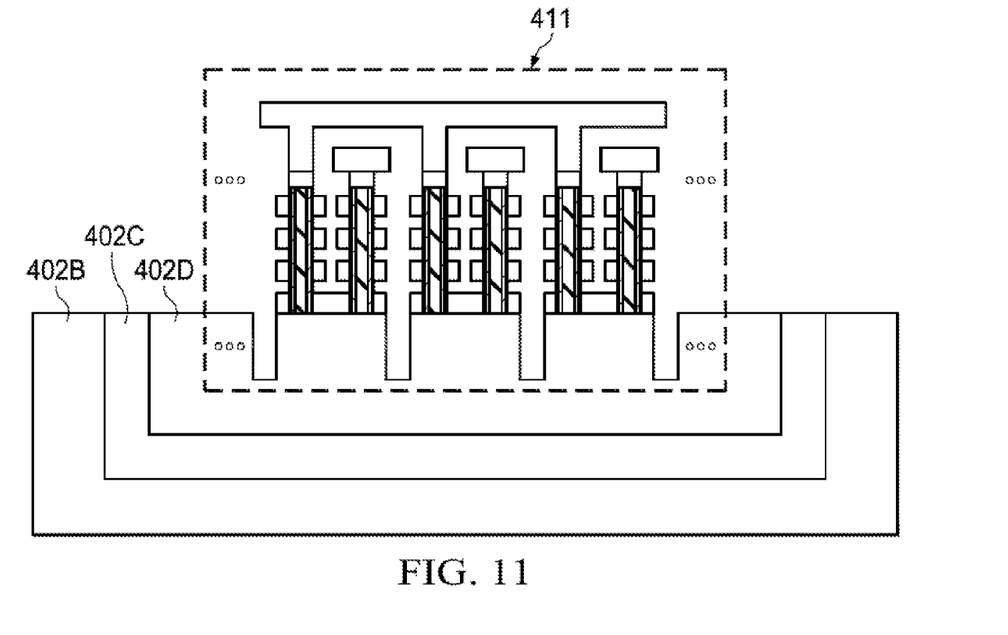
FIG. 11 is a simplified view of a pocket p-well structure of a U-shaped common-body NAND flash device according to an embodiment of the disclosure.

The NAND flash cell strings may be manufactured on the substrate 401 in a way that they are formed in a pocket p-well structure as shown in FIG. 11. Like for conventional NAND cells which are shown in FIG. 6, the cell body node may be identical to the node of the pocket p-well 402D. Thus, biasing the cell body node is achieved by biasing the entire cell substrate, here the pocket p-well 402D. The pocket p-well 402D may be isolated from the p-well 402B of the rest of the chip by a tub n-well 402C as in most known NAND flash devices.

The embodiments described herein are examples of structures, systems or methods having elements corresponding to elements of the techniques of this application. This written description may enable those skilled in the art to make and use embodiments having alternative elements that likewise correspond to the elements of the techniques of this application. The intended scope of the techniques of this application thus includes other structures, systems or methods that do not differ from the techniques of this application as described herein, and further includes other structures, systems or methods with insubstantial differences from the techniques of this application as described herein.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

Also, techniques, systems, subsystems and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component, whether electrically, mechanically, or otherwise. Other examples of changes, substitutions, and Alterations are ascertainable by one skilled in the art and may be made without departing from the spirit and scope disclosed herein.

What is claimed is:

1. A NAND flash memory device comprising:
a substrate formed of a semiconducting material, the substrate having an intermediate substrate region free from any source/drain region;
at least first and second vertical pillars each including a plurality of memory cells, and the second vertical pillar being adjacent to the first vertical pillar, and the first vertical pillar including a first body portion, a first bottom portion and a first top portion, and the second vertical pillar including a second body portion, a second bottom portion and a second top portion, and the first and second body portions being in contact with the substrate and comprised of first and second semiconductor films respectively, and the first and second bottom portions also being in contact with the substrate, and the intermediate substrate region of the substrate being located between the first and second bottom portions;
a first gate electrode that is not a part of a memory cell, the first gate electrode surrounding the first and second bottom portions such that the first and second body portions each penetrate the first gate electrode, and the first gate electrode being located on at least the intermediate substrate region with only a gate dielectric intervening between the first gate electrode and the intermediate substrate region; and
first and second source/drain regions, the first source/drain region being located at the first top portion of the first vertical pillar, the second source/drain region being located at the second top portion of the second vertical pillar.

2. The NAND flash memory device of claim 1, wherein the substrate further includes a well region, the well region extending to an upper surface of the intermediate substrate region.

3. The NAND flash memory device of claim 2, wherein the first gate electrode is a first transistor gate electrode, and the first gate electrode being operable between an on-state and an off-state.

4. The NAND flash memory device of claim 3, wherein a continuous channel region is formed, in at least in the well region, in the case of the on-state of the first gate electrode, and the continuous channel region extending at least to the intermediate substrate region and the first and second bottom portions, such that the continuous channel region has a portion that is substantially U-shaped.

5. The NAND Flash memory device of claim 4, wherein the NAND Flash memory device is operable in an erase bias condition, and
wherein the well, the intermediate substrate region, the first body portion and the second body portion form a single electrical node during the erase bias condition, and
wherein a conductivity type of the well, the first body portion and the second body portion is the same.

6. The NAND Flash device of claim 5, wherein the first and second body portions are directly connected to the well, without being separated by a region of different conductivity type.

7. The NAND Flash memory device of claim 1, wherein the first and second vertical pillars include first and second dielectric cores respectively, the first dielectric core being surrounded by the first body portion, and the second dielectric core being surrounded by the second body portion.

8. The NAND Flash memory device of claim 1, wherein the substrate includes a first protruding portion and first and second recessed portions,
wherein the first gate electrode covers the first protruding portion but not first and second recessed portions, and
wherein the first and second recessed portions are each located at opposite sides of the first protruding portion.

9. The NAND Flash memory device of claim 1, further comprising:
a third vertical pillar adjacent to the second vertical pillar, and the third vertical pillar having a structure at least substantially identical to the first vertical pillar;
a fourth vertical pillar adjacent to the third vertical pillar, and the fourth vertical pillar having a structure at least substantially identical to the second vertical pillar;
a second gate electrode adjacent to the first gate electrode and electrically isolated from the first gate electrode, and the second gate electrode having a structure at least substantially identical to the first gate electrode; and
a first interconnection wire that is:
  i) connected to the first and third vertical pillars, and
  ii) not connected to the second and fourth vertical pillars, and
wherein the first and second vertical pillars share the first gate electrode, and the third and fourth vertical pillars share the second gate electrode.

* * * * *